United States Patent
Khonsari

(10) Patent No.: US 9,090,456 B2
(45) Date of Patent: Jul. 28, 2015

(54) SYSTEM AND METHOD OF MANUFACTURING AN ELECTROMECHANICAL DEVICE BY PRINTING RAISED CONDUCTIVE CONTOURS

(75) Inventor: Nassim Khonsari, Redwood City, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 453 days.

(21) Appl. No.: 12/619,521

(22) Filed: Nov. 16, 2009

(65) Prior Publication Data

US 2011/0113616 A1 May 19, 2011

(51) Int. Cl.
*H05K 3/02* (2006.01)
*B81B 7/00* (2006.01)

(52) U.S. Cl.
CPC ........... *B81B 7/007* (2013.01); *B81B 2201/042* (2013.01); *B81B 2207/07* (2013.01); *B81B 2207/098* (2013.01); *B81C 2201/0184* (2013.01); *B81C 2203/0109* (2013.01); *Y10T 29/49002* (2015.01); *Y10T 29/51* (2015.01)

(58) Field of Classification Search
CPC B81C 1/00238; B81C 1/00269; H01L 23/10; H01L 24/75; H01L 24/81; B22F 1/0074; B22F 3/1021; B22F 9/24; B22F 3/24; H03H 9/1021; B81B 2201/047; B41J 2/2054; G06K 15/107
USPC ........ 29/830–831, 846–847, 852, 592.1, 825; 257/704, 692–698
See application file for complete search history.

(56) References Cited

U.S. PATENT DOCUMENTS

| 4,954,789 | A | 9/1990 | Sampsell |
| 5,578,874 | A * | 11/1996 | Kurogi et al. ................. 257/778 |
| 5,784,189 | A | 7/1998 | Bozler et al. |
| 6,040,937 | A | 3/2000 | Miles |
| 6,373,130 | B1 * | 4/2002 | Salaville ........................ 257/704 |
| 6,574,033 | B1 | 6/2003 | Chui et al. |
| 6,674,562 | B1 | 1/2004 | Miles et al. |
| 6,836,961 | B2 * | 1/2005 | Kang ............................. 29/832 |
| 7,042,643 | B2 | 5/2006 | Miles |
| 7,123,216 | B1 | 10/2006 | Miles |
| 7,129,576 | B2 * | 10/2006 | Humpston ................... 257/704 |

(Continued)

FOREIGN PATENT DOCUMENTS

EP 1 978 555 10/2008
JP 2007165419 A 6/2007

(Continued)

OTHER PUBLICATIONS

ISR and WO dated Aug. 1, 2011 for PCT/US10/056410.

(Continued)

*Primary Examiner* — Minh Trinh
(74) *Attorney, Agent, or Firm* — Knobbe, Martens, Olson & Bear, LLP

(57) ABSTRACT

A system and method for manufacturing a display device having an electrically connected front plate and back plate are disclosed. In one embodiment, the method comprises printing conductive raised contours onto a non-conductive back plate, aligning the back plate with a non-conductive front plate such that the raised contours align with conductive routings on the front plate to electrically connect the raised contours and the routings, and sealing the back plate and the front plate.

8 Claims, 10 Drawing Sheets

(56) References Cited

U.S. PATENT DOCUMENTS

| | | | |
|---|---|---|---|
| 7,327,510 | B2 | 2/2008 | Cummings et al. |
| 7,523,546 | B2* | 4/2009 | Vatanparast et al. ............ 29/832 |
| 7,560,299 | B2 | 7/2009 | Cummings |
| 7,726,015 | B2* | 6/2010 | Desagulier et al. ............. 29/846 |
| 7,889,163 | B2 | 2/2011 | Chui et al. |
| 7,940,531 | B2* | 5/2011 | Watanabe .................... 361/760 |
| 7,990,604 | B2 | 8/2011 | Lee et al. |
| 2002/0054005 | A1 | 5/2002 | Edwards et al. |
| 2002/0090803 | A1 | 7/2002 | Salaville |
| 2004/0115864 | A1* | 6/2004 | Sakurai et al. ................ 438/106 |
| 2005/0067681 | A1* | 3/2005 | De Villeneuve et al. ...... 257/678 |
| 2005/0142685 | A1* | 6/2005 | Ouellet et al. .................. 438/51 |
| 2006/0067642 | A1 | 3/2006 | Tyger |
| 2006/0076631 | A1 | 4/2006 | Palmateer et al. |
| 2006/0076632 | A1 | 4/2006 | Palmateer et al. |
| 2006/0077533 | A1 | 4/2006 | Miles et al. |
| 2007/0164444 | A1 | 7/2007 | Sekido et al. |
| 2007/0297037 | A1 | 12/2007 | Khonsari et al. |
| 2008/0279498 | A1 | 11/2008 | Sampsell et al. |
| 2010/0245313 | A1 | 9/2010 | Lewis et al. |
| 2011/0012219 | A1 | 1/2011 | Lin et al. |
| 2011/0038132 | A1 | 2/2011 | Ochiai |

FOREIGN PATENT DOCUMENTS

| | | |
|---|---|---|
| JP | 2009202261 A | 9/2009 |
| WO | WO-2007074846 A1 | 7/2007 |
| WO | WO-2008066087 A1 | 6/2008 |

OTHER PUBLICATIONS

IPRP dated May 3, 2012 for PCT/US10/056410.

* cited by examiner

|  | Column Output Signals | |
|---|---|---|
|  | $+V_{bias}$ | $-V_{bias}$ |
| Row Output Signals  0 | Stable | Stable |
| $+\Delta V$ | Release | Actuate |
| $-\Delta V$ | Actuate | Release |

SYSTEM AND METHOD OF MANUFACTURING AN ELECTROMECHANICAL DEVICE BY PRINTING RAISED CONDUCTIVE CONTOURS

BACKGROUND

1. Field

The field of the invention relates to displays and accelerometers.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively transmits, absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

One aspect is a method of manufacturing an electromechanical device, the method comprising printing conductive raised contours onto a non-conductive back plate, aligning the back plate with a non-conductive front plate such that the raised contours align with conductive routings on the front plate to electrically connect the raised contours and the routings, and sealing the back plate and the front plate.

Another aspect is a system for manufacturing an electromechanical device, the system comprising a printer configured to print conductive raised contours onto a non-conductive back plate, a coordinator configured to align the back plate with a non-conductive front plate such that the raised contours align with conductive routings on the front plate to electrically connect the raised contours and the routings, and a sealer configured to seal the back plate and the front plate.

Another aspect is a system for manufacturing an electromechanical device, the system comprising means for printing conductive raised contours onto a non-conductive back plate, means for aligning the back plate with a non-conductive front plate such that the raised contours align with conductive routings on the front plate to electrically connect the raised contours and the routings, and means for sealing the back plate and the front plate.

DETAILED DESCRIPTION OF THE PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

One embodiment of a display device comprises a plurality of display elements and conductive routings formed on a substrate (front plate) and also comprises a back plate to, among other things, provide additional support for and protect the display elements. Because the placement, size, and structure of the conductive routings on the front plate are limited by their potential visibility, additional functionality of the display device can be realized by depositing electric routings on the back plate and electrically connecting the routings on the front plate with those on the back plate. In one embodiment, electrical routings are printed onto the back plate during manufacture using inkjet printing. In other embodiments, the electrical routings are deposited via plating, raised sandblasting, or screen printing.

Figure 1:
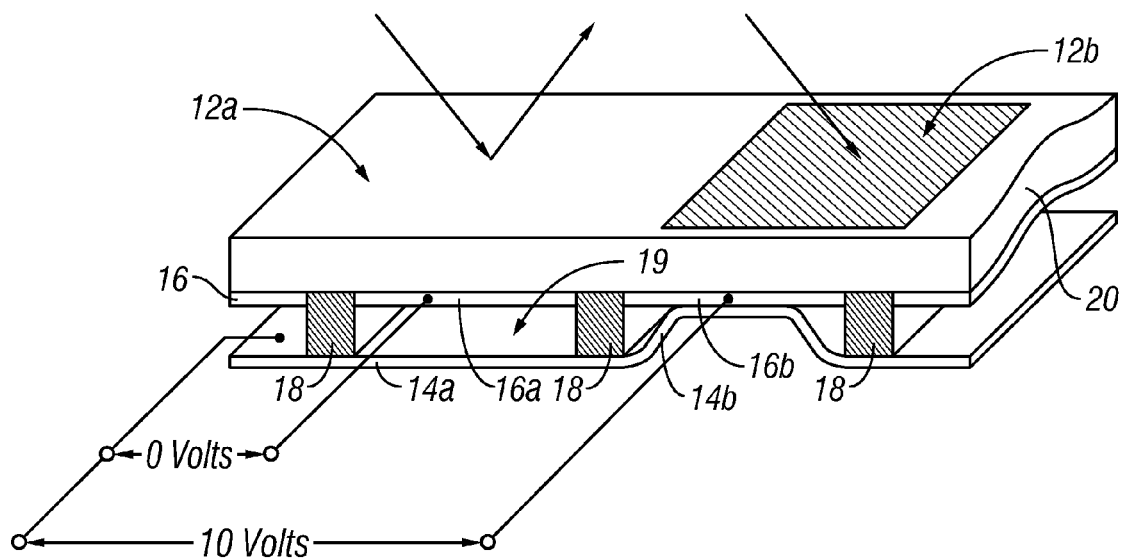
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. In some embodiments, the layers are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
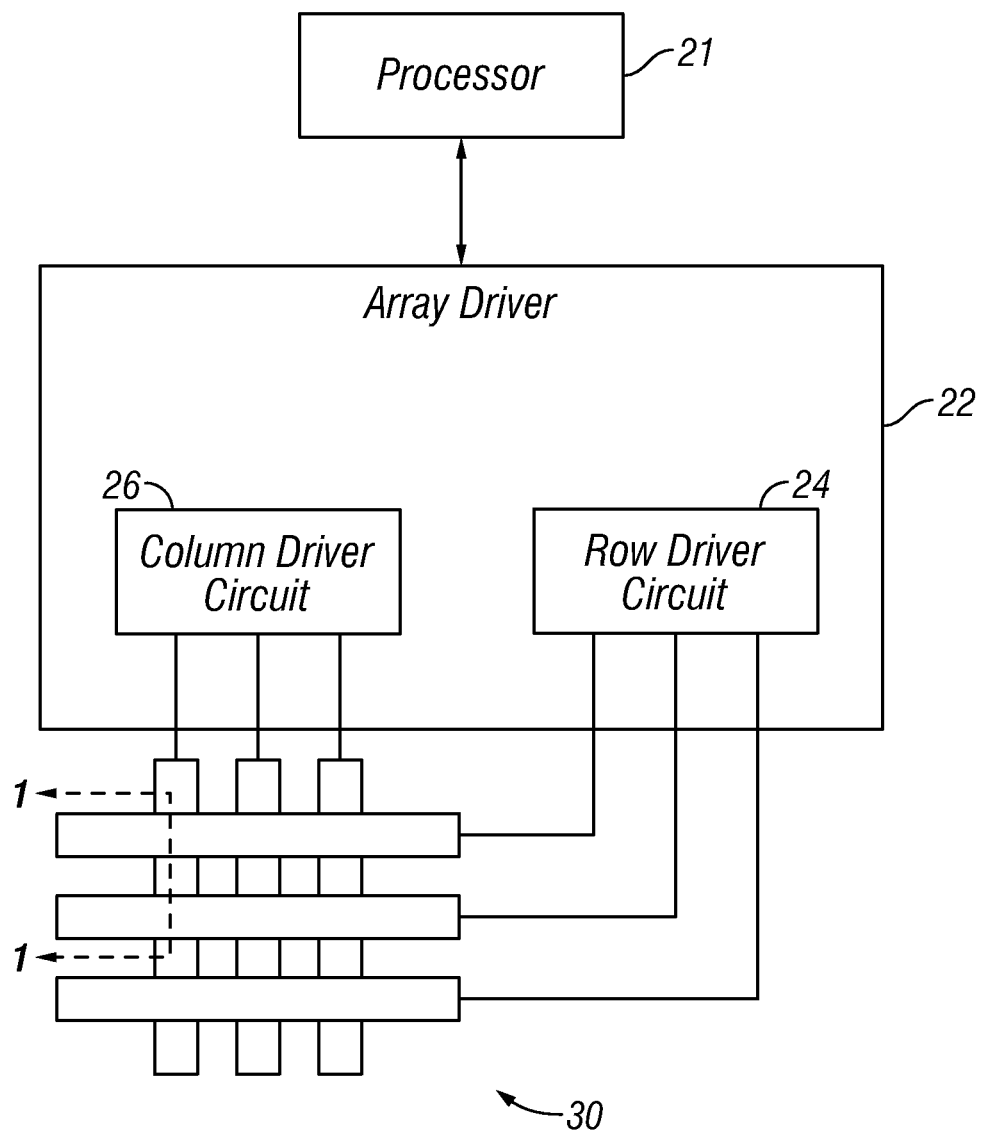
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a panel or display array (display) 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
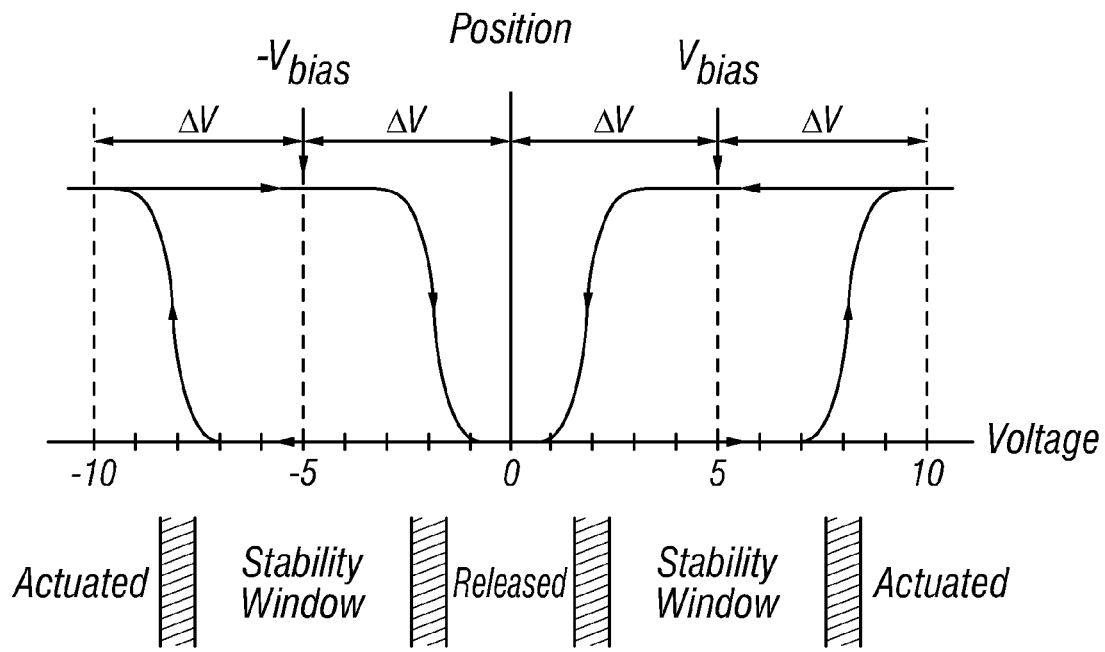
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$ or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
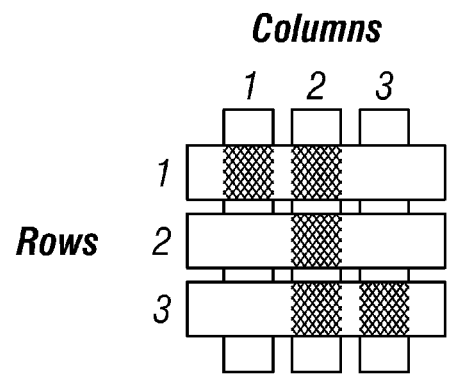
FIGS. 5A and 5B illustrate one exemplary timing diagram for row and column signals that may be used to write a frame of display data to the 3×3 interferometric modulator display of FIG. 2.
Figure 5B:
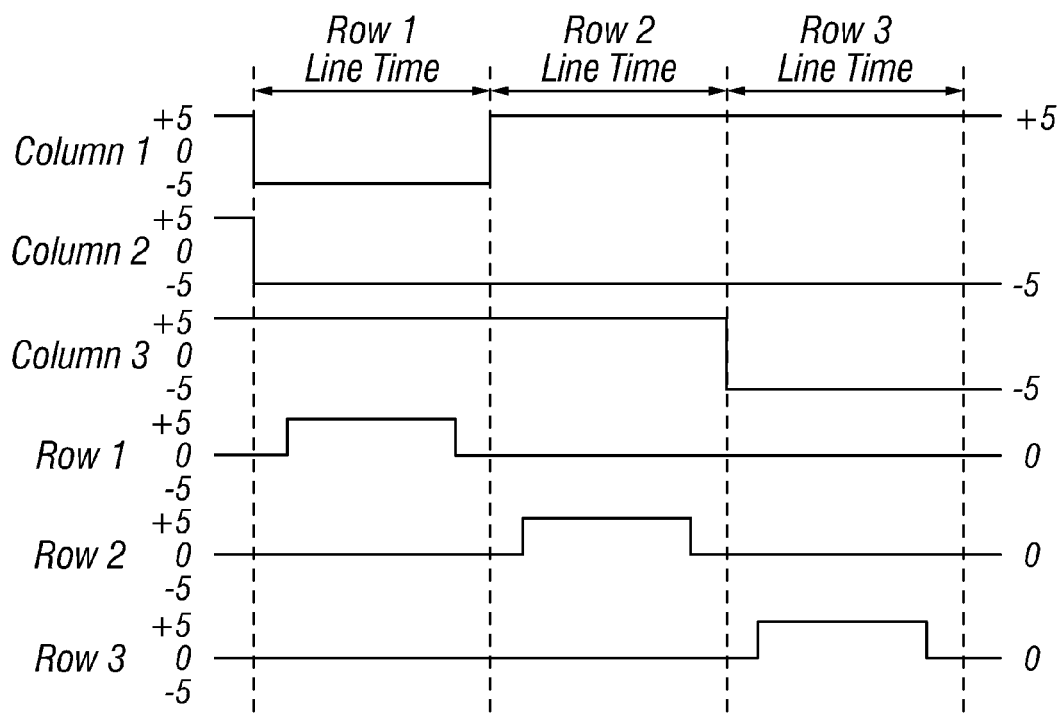

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
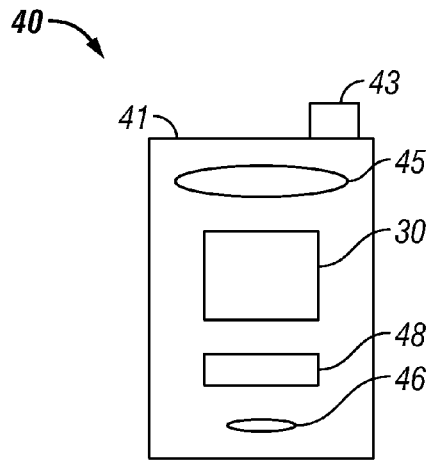
FIGS. 6A and 6B are system block diagrams illustrating an embodiment of a visual display device comprising a plurality of interferometric modulators.
Figure 6B:
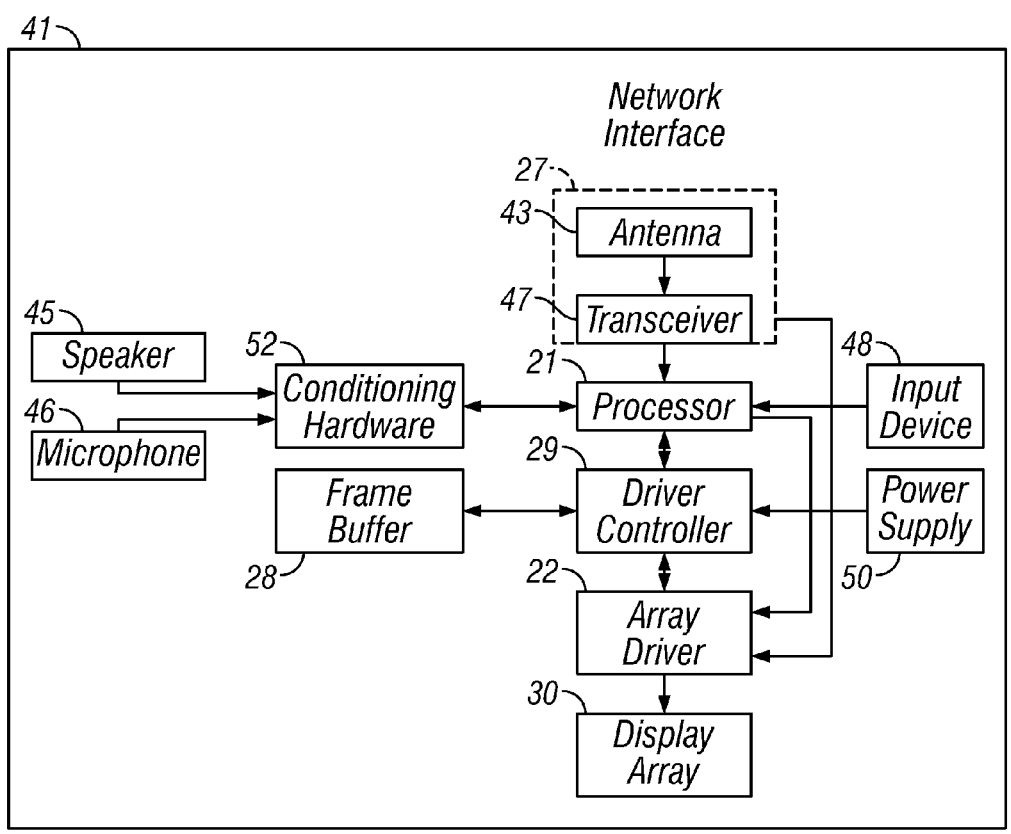

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to the processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28 and to the array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
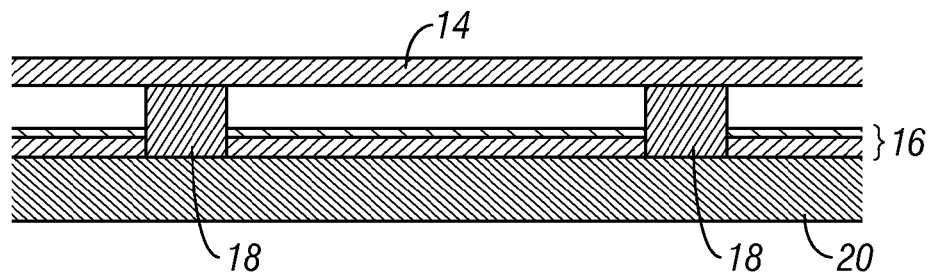
FIG. 7A is a cross section of the device of FIG. 1.
Figure 7B:
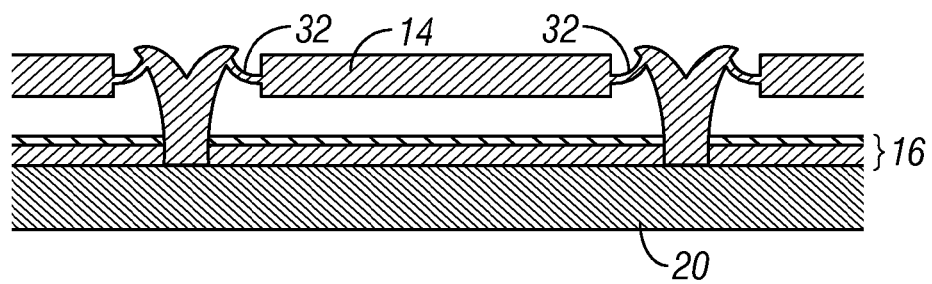
FIG. 7B is a cross section of an alternative embodiment of an interferometric modulator.
Figure 7C:
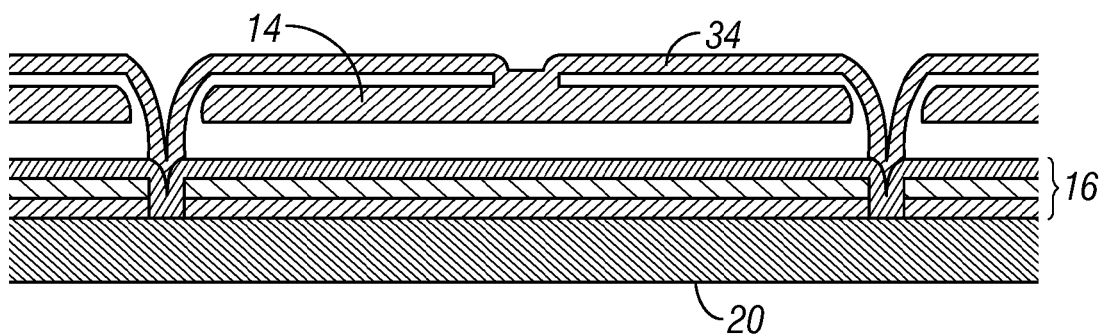
FIG. 7C is a cross section of another alternative embodiment of an interferometric modulator.
Figure 7D:
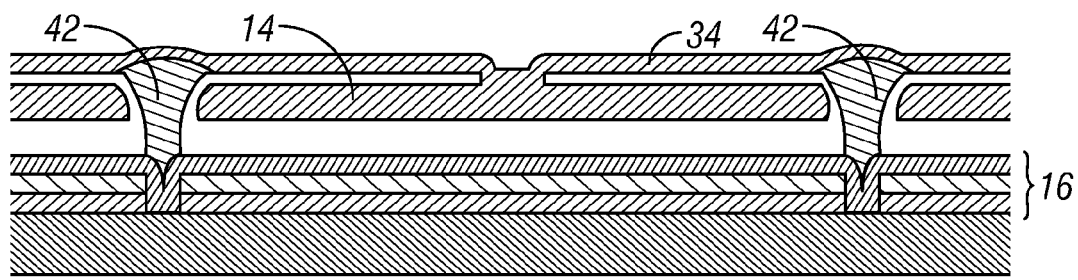
FIG. 7D is a cross section of yet another alternative embodiment of an interferometric modulator.
Figure 7E:
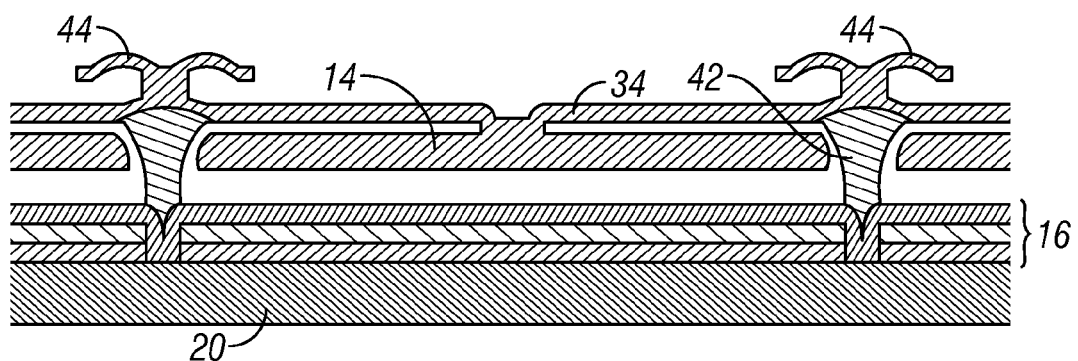
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields some portions of the interferometric modulator on the side of the reflective layer opposite the substrate 20, including the deformable layer 34 and the bus structure 44. This allows the shielded areas to be configured and operated upon without negatively affecting the image quality. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

As described above, one embodiment of a display device comprises a plurality of display elements and conductive routings formed on a front plate. In one embodiment, the display elements are interferometric modulators such as those illustrated in FIGS. 7A-7E and the conductive routings include row electrodes and column electrodes for driving the interferometric modulators as described above with respect to FIGS. 5A-5B. The conductive routings can also include routings which interconnect the various elements of the display device illustrated in FIGS. 6A-6B.

Because the conductive routings are potentially visible through the transparent front plate, the placement, size, and structure of the conductive routings are limited. For example, the conductive routings may include row electrodes and column electrodes at the periphery of a matrix of display elements, which do not interfere with the visual quality of an image displayed by the matrix. Additional functionality of the display device can be realized by forming conductive routings on the back plate and electrically connecting the conductive routings on each plate via conductive raised contours. The size, placement, and structure of the conductive routing on the back plate are far less limited, as they may be placed behind display elements without interfering with their visual appearance.

In one embodiment, conductive raised contours are printed onto the back plate. In one embodiment, the conductive routings, or conductive traces, are simultaneously printed onto the back plate, or printed as part of the same printing process. In another embodiment, conductive routings or traces are previously or later formed onto the back plate, via printing or some other method. In one embodiment, the conductive raised contours are printed via inkjet printing, whereas in other embodiments, the contours are deposited via plating, raised sandblasting, or screen printing.

Figure 8A:
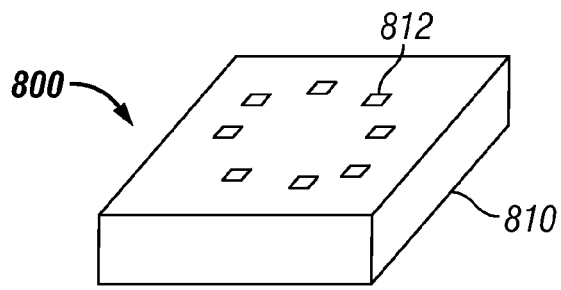
FIGS. 8A-8D are plan views of a back plate in various stages of manufacture.

FIGS. 8A-8D show a back plate in various stages of manufacture. In FIG. 8A, the back plate 800 begins as a substrate 810. The substrate 810 can be any of a number of materials. In one embodiment, the substrate 810 is the same material as that of the front plate. Accordingly, the substrate 810 can be transparent, made of, for example, glass or plastic. However, in another embodiment, the substrate 810 is made of a different material than that of the front plate. Since the back plate 800 is behind the display elements when viewed from the front, the back plate 800, and therefore the substrate 810, need not be transparent. In one embodiment, the substrate 810 is non-conductive. In another embodiment, the substrate 810 is conductive, in which case a passivation layer may be formed on the substrate to electrically isolate any conductive routings, contours, or traces.

Suitable substrate materials include, but are not limited to, metals (e.g. stainless steel, aluminum), anodized metals, silicon (e.g. a silicon wafer), poly-silicon, plastics, ceramics, polymers (e.g. polyimide, MYLAR®), carbon (e.g. graphite), glass, and quartz, as well as alloys and composites of such materials. In certain embodiments in which the substrate 810 comprises a flexible plastic or metal foil material, the substrate has sufficient flexibility to be used in "roll-to-roll" or "web" processing in which electronic circuitry (e.g., thin-film transistors, resistors, capacitors) are formed on the substrate (e.g., via deposition or photolithography techniques). In certain such embodiments, the circuitry can be fabricated across large areas (e.g. one meter or more in length). In one embodiment, the substrate 810 is an opaque plastic substrate which includes a passivated printed circuit board. In certain such embodiments, the passivated printed circuit board can be fabricated to include desired circuitry. The substrate 810 may also comprise a laminate of a plurality of substrate materials. The substrate 810 may be rigid or flexible. For example, a flexible substrate 810 may comprise a thin metal or plastic foil. Although not limited to the thickness ranges recited herein, the substrate may have a thickness of about 0.1 millimeter to about 1.0 millimeter, and more preferably from about 0.3 millimeter to about 0.7 millimeter. A thin opaque substrate can be obtained by metal forming operations such as drawing (e.g., stretching a sheet of metal over or through at least one die to make it thinner).

The substrate 810 is preferably impermeable to moisture and properly passivated. In various embodiments, a protective passivation layer is formed on a surface of an opaque substrate. In certain embodiments, forming the passivation layer prepares the substrate 810 for subsequent processing (e.g., formation of the conductor or dielectric layer). In certain embodiments in which a metal substrate is used, the passivation layer provides electrical isolation to keep other structures from shorting to the metal substrate. The protective passivation layer need not be a separate layer, but can be formed on top of the opaque substrate by preliminary passivation treatment. The passivation treatment of certain embodiments includes, but is not limited to, removal of exogenous iron or iron compounds from a surface by means of a chemical dissolution, most typically by a treatment with an acid solution that will remove the surface contamination, but will not significantly affect the opaque substrate itself. Such treatments include chemical treatment of an opaque substrate with a mild oxidant, such as a nitric acid solution, for the purpose of enhancing the spontaneous formation of a protective passivation layer. In addition, the passivation step can include oxide deposition and spin coating of an organic planarization layer.

Figure 8B:
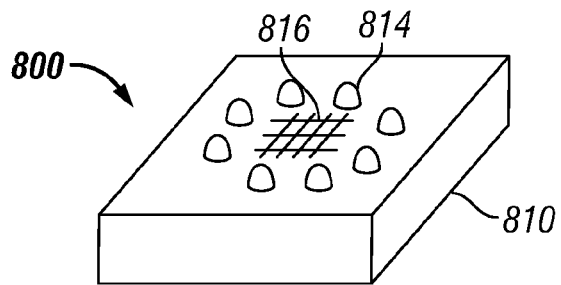

FIG. 8B shows a back plate 810 having conductive raised contours 814. In one embodiment, a desiccation pattern 816 is simultaneously formed onto the substrate 810. The conductive raised contours 814 can be printed onto the substrate using inkjet printing. Printing the contours 814 provides benefits over other methods of forming the contours 814 as their size and pattern can be more finely controlled. For example, in one embodiment, the raised contours 814 are smaller than the routings to which they will be aligned. The raised contours 814 can be printed from conductive ink. In one embodiment, the raised contours 814 are printed from molten metal, which cools into the form of the printed raised contours 814. In another embodiment, conductive traces (now shown) are also printed onto the substrate 810. These conductive traces can be printed so as to electrically connect to conductive vias which extend through the substrate 810. The conductive traces may, e.g., electrically connect the conductive raised contours to the conductive vias, which are further coupled to a processor.

Figure 8C:
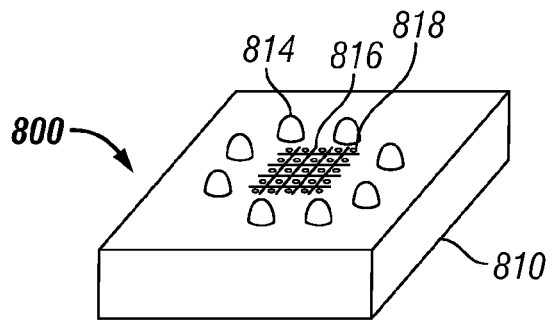

In FIG. 8C, the back plate 800 includes a desiccant 818 deposited onto the desiccation pattern 816. The desiccation pattern 816 can be in the form of a grid or any other pattern. The desiccation pattern 816 provides additional surface area for the desiccant 818 to attach. The desiccant 818 is a hygroscopic substance that maintains a state of dryness in an area about the desiccant by, for example, absorbing water and water vapor. The desiccant 818 can be, for example, silica gel, calcium oxide, calcium chloride, calcium sulfate, montmorillonite clay, molecular sieves, and/or mixtures thereof.

Figure 8D:
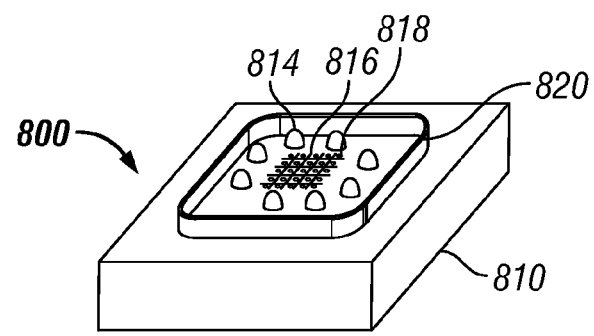

In FIG. 8D, the back plate 800 further includes a sealant 820 deposited around the edges of the substrate 810. Although FIG. 8D illustrates the seal forming a closed shape around the raised contours 814 and the desiccant 818, in other embodiments, the sealant 820 does not form a closed shape. In other embodiments, the sealant forms a closed shape which does not encompass all of the raised contours 814. The sealant 820 can be epoxy-based adhesive or a PIB, o-ring, polyurethane, liquid spin-on glass, solder, polymers, or plastics. The sealant is, in one embodiment, non-conductive.

Figure 9A:
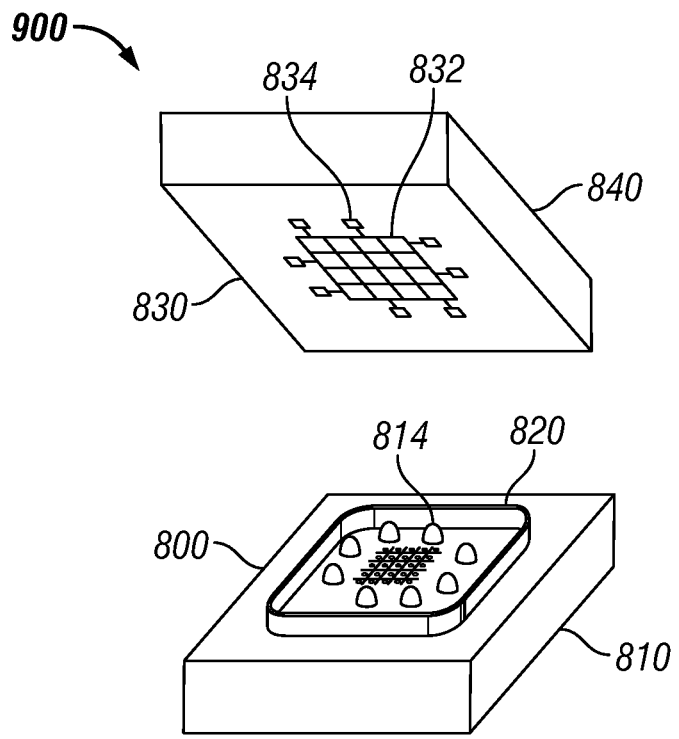
FIG. 9A is a plan view of an aligned front plate and back plate.
Figure 9B:
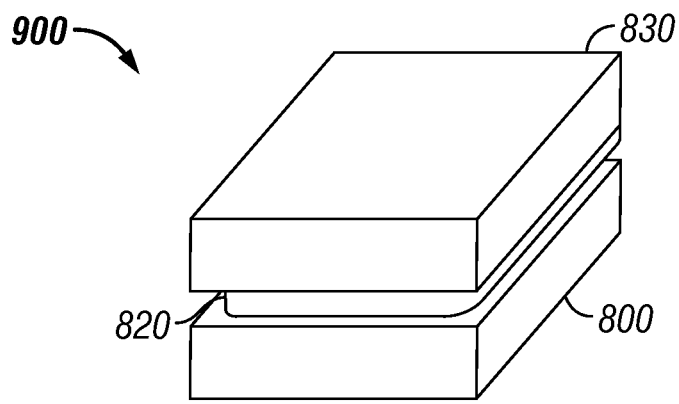
FIG. 9B is a plan view of a display device having a sealed front plate and back plate.

FIG. 9A illustrates a partially formed display device 900 including a back plate 800 as described above with respect to FIGS. 8A-8D and a front plate 830. The front plate 830 includes a transparent substrate 840, such as glass or plastic, on which display elements 832 and conductive routings 834 are formed. In one embodiment, the display elements 832 are interferometric modulators and the conductive routings 834 include row and column electrodes. In order to manufacture the display device 900, the front plate 830 and back plate 800 are aligned such that conductive routings 834 on the front plate are matched to raised contours 814 on the back plate 800. In one embodiment, the raised contours 814 are printed to a height, as measured perpendicular to the substrate 810, which is greater than the height, as measured perpendicular to the substrate 840, of the display elements 832. After the front plate 830 and back plate 800 are aligned, they are pressed together such that the raised contours 814 electrically connect to the conductive routings 832 and such that the sealant 820 adheres the front plate 830 to the back plate 800. In one embodiment, the sealant 820 forms a hermitic or partially hermitic seal within its confines and in which the display elements 834 and desiccant 816 reside. In one embodiment, the conductive routings 834 extend under the sealant and beyond the interior of the seal. FIG. 9B illustrates a partially formed display device 900 after the back plate 800 and front plate 830 have been sealed together by the sealant 820.

Figure 10:
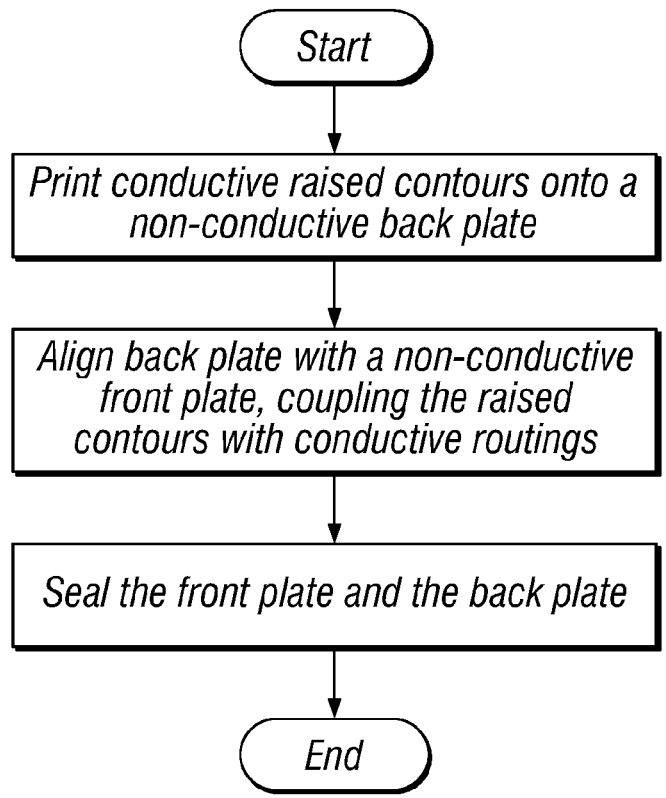
FIG. 10 is a flowchart of a method of manufacturing a display device having an electrically connected front plate and back plate.

FIG. 10 is a flowchart illustrating a method of manufacturing a display device having an electrically connected front plate and back plate. The process 1000 begins, with a front plate and a back plate, in block 1010, in which conductive raised contours are printed onto a non-conductive back plate. As used herein, a "non-conductive back plate" does not mean that the back plate contains no conductive elements, but rather that non-contacting printed patterns are electrically isolated immediately after printing. Thus, the non-conductive back plate can be a metal substrate on which a non-conductive isolation layer has been deposited onto which the conductive raised contours are printed. Thus, non-contacting conductive contours, by virtue of being printed on the isolation layer, are not electrically coupled after the printing in block 1010. In one embodiment, the conductive raised contours are printed using inkjet printing. The printing can be performed, for example, by the printer described below with respect to FIG. 11.

Next, in block 1020, the back plate is aligned with a non-conductive front plate. Similar to the definition of "non-conductive back plate" described above, a "non-conductive front plate" does not mean that the front plate contains no conductive elements, but rather that certain of the conductive elements are electrically isolated from one another. The back plate and front plate are aligned such that the conductive raised contours are electrically coupled to conductive routings formed on the front plate. The alignment may be performed, for example, by the coordinator described below with respect to FIG. 11. Finally, in block 1030, the front plate and back plate are sealed together. In one embodiment, this involves pressing the aligned front plate and back plate together so as to activate adhesive properties of a sealant as described above with respect to FIGS. 9A-9B. In another embodiment, the front plate and back plate are sealed together via complementary latching mechanisms formed on each plate. The sealing may be performed, for example, by the sealer described below with respect to FIG. 11.

Figure 11:
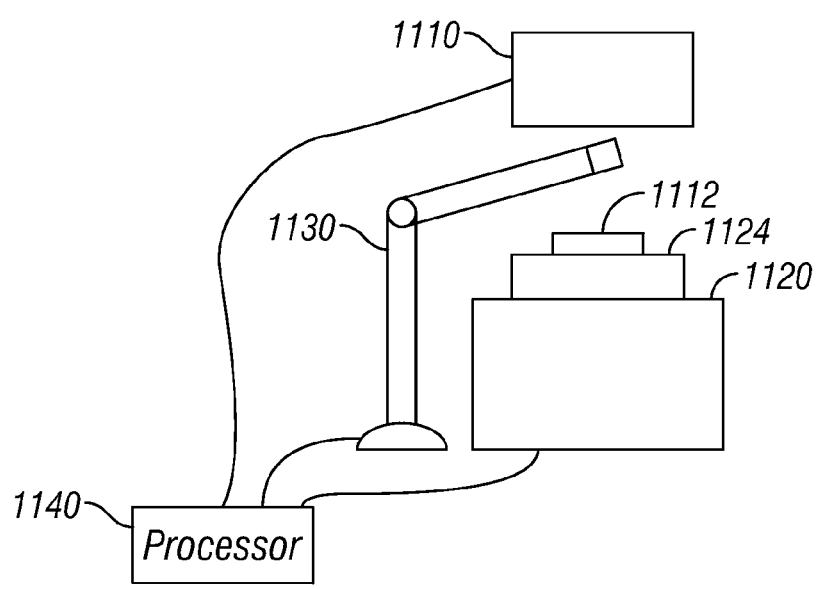
FIG. 11 is a block diagram of a system for manufacturing a display device having an electrically coupled front plate and back plate.

FIG. 11 is a block diagram of a system for manufacturing a display device having an electrically coupled front plate and back plate. The system 1100 includes a printer 1110 for printing raised conductive contours onto a back plate. The back plate may be aligned, by the coordinator 1120 or by other means, prior to the printing. For example, the back plate may be fitted into a support 1122, which is aligned with respect to the printer 1110. In one embodiment, the printer 1110 is an inkjet printer, which propels conductive ink or molten metal towards the back plate at precise locations.

The system 1100 further includes a coordinator 1120 for aligning the back plate with a front plate such that printed raised contours electrically connect with corresponding conductive routings on the front plate. In one embodiment, the coordinator 1120 includes a back support 1122 into which the back plate it fitted. A similar shaped front plate can also be aligned by the support 1122. In another embodiment, the coordinator 1120 includes a motor 1124, which may be a one-, two-, or three-stage motor, for moving one or both of the plates into the appropriate position. The coordinator 1120 can further include a sensor 1124 for sensing the position of one or both of the plates or for sensing when the raised contours have been electrically coupled to the conductive routings.

Once the plates are aligned, the sealer 1130 seals the two plates together. In one embodiment, the sealer 1130 deposits sealant via an injector 1132 onto the front plate or back plate. In another embodiment, the sealer 1130 includes a mechanical press 1134, which applies force pressing the two plates together. Such a mechanical press may be automatic or operated by hand.

In the embodiment illustrated in FIG. 11, the system 1100 includes a controller 1140 for controlling one or more of the printer 1110, the coordinator 1120, and the sealer 1130. In one embodiment, for example, the controller 1140 receives data from the sensor 1122 and instructs the motor 1122 to move one or both of the plates accordingly. The system 1100 may also include an input device for receiving commands from an operator and an output device for outputting information regarding the manufacturing process to the operator.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A method of manufacturing an electromechanical device, the method comprising:
    printing conductive raised contours and conductive traces onto a non-conductive back plate;
    aligning the back plate with a non-conductive front plate such that the raised contours align with conductive routings on the front plate to electrically connect the raised contours and the routings;
    printing a mesh on the back plate; and
    sealing the back plate and the front plate.

2. The method of claim 1, wherein the conductive traces electrically connect the conductive routings to driver circuitry.

3. The method of claim 1, wherein the conductive traces electrically connect the conducting routings to one or more conductive vias extending through the back plate.

4. The method of claim 1, further comprising depositing a desiccant within the printed mesh.

5. The method of claim 1, further comprising plating the conductive routings on the front plate.

6. The method of claim 1, further comprising generating a plurality of display elements on the front plate.

7. The method of claim 6, wherein the display elements are interferometric modulators.

8. A method of manufacturing an electromechanical device, the method comprising:
    inkjet printing conductive raised contours onto a non-conductive back plate;
    aligning the back plate with a non-conductive front plate such that the raised contours align with conductive routings on the front plate to electrically connect the raised contours and the routings;
    printing a mesh on the back plate; and
    sealing the back plate and the front plate.

* * * * *